(12) United States Patent
Kulick et al.

(10) Patent No.: US 10,896,898 B2
(45) Date of Patent: Jan. 19, 2021

(54) EDGE INTERCONNECT SELF-ASSEMBLY SUBSTRATE

(71) Applicant: Indiana Integrated Circuits, LLC, South Bend, IN (US)

(72) Inventors: Jason M. Kulick, South Bend, IN (US); Tian Lu, Osceola, IN (US)

(73) Assignee: Indiana Integrated Circuits, LLC, South Bend, PA (US)

( * ) Notice: Subject to any disclaimer, the term of this patent is extended or adjusted under 35 U.S.C. 154(b) by 0 days.

(21) Appl. No.: 15/333,325

(22) Filed: Oct. 25, 2016

(65) Prior Publication Data

US 2017/0125389 A1   May 4, 2017

Related U.S. Application Data

(60) Provisional application No. 62/247,477, filed on Oct. 28, 2015, provisional application No. 62/247,457, filed on Oct. 28, 2015, provisional application No. 62/247,439, filed on Oct. 28, 2015.

(51) Int. Cl.
| | | |
|---|---|---|
| *H01L 25/10* | (2006.01) | |
| *H01L 25/00* | (2006.01) | |
| *H01L 25/065* | (2006.01) | |
| *H01L 29/06* | (2006.01) | |
| *H01L 23/498* | (2006.01) | |
| *H01L 23/13* | (2006.01) | |

(52) U.S. Cl.
CPC ........ *H01L 25/105* (2013.01); *H01L 25/0655* (2013.01); *H01L 25/50* (2013.01); *H01L 29/0657* (2013.01); *H01L 23/13* (2013.01); *H01L 23/49805* (2013.01); *H01L 2225/1064* (2013.01); *H01L 2225/1082* (2013.01)

(58) Field of Classification Search
CPC .................. H01L 25/50; H01L 25/105; H01L 2225/1082; H01L 2225/1064; H01L 21/76897; H01L 23/525–5258; H01L 23/538; H01L 23/5381; H01L 23/5382; H01L 23/5386; H01L 2225/1076
See application file for complete search history.

(56) References Cited

U.S. PATENT DOCUMENTS

| | | | |
|---|---|---|---|
| 7,608,919 B1 * | 10/2009 | Bernstein | H01L 23/60 |
| | | | 257/685 |
| 7,612,443 B1 | 11/2009 | Bernstein et al. | |
| 7,716,821 B2 * | 5/2010 | Yan | H05K 3/366 |
| | | | 228/180.22 |
| 9,633,976 B1 * | 4/2017 | Bernstein | H01L 25/0655 |
| 2001/0053565 A1 * | 12/2001 | Khoury | H01L 23/13 |
| | | | 438/121 |
| 2008/0017971 A1 * | 1/2008 | Hollis | H01L 23/645 |
| | | | 257/698 |

(Continued)

*Primary Examiner* — Thanh Y. Tran
(74) *Attorney, Agent, or Firm* — The Webb Law Firm (57) ABSTRACT

A substrate assembly includes a first microchip including a first interconnecting structure and a second microchip including a second interconnecting structure, wherein the first and second interconnecting structures have keyed complementary, interlocking shapes. The first interconnecting structure is interlocked with the second interconnecting structure. Quilt package nodules on edges of the first and second microchips electrically connect circuitry formed on or supported by the first and second microchips.

13 Claims, 7 Drawing Sheets

(56) References Cited

U.S. PATENT DOCUMENTS

| | | | |
|---|---|---|---|
| 2009/0085183 A1* | 4/2009 | Mitchell | H01L 23/10 257/686 |
| 2010/0059897 A1* | 3/2010 | Fay | H01L 24/03 257/777 |
| 2011/0299255 A1 | 12/2011 | Nakanishi et al. | |
| 2013/0105984 A1 | 5/2013 | Rathburn | |
| 2017/0162532 A1* | 6/2017 | Kulick | H01L 24/32 |

* cited by examiner

EDGE INTERCONNECT SELF-ASSEMBLY SUBSTRATE

CROSS REFERENCE TO RELATED APPLICATION

This application claims the benefit of U.S. Provisional Patent Application Nos. 62/247,439; 62/247,457; and 62/247,477, all of which were filed on Oct. 28, 2015, and all of which are incorporated herein by reference in their entirety.

BACKGROUND OF THE INVENTION

Field of the Invention

This application relates generally to microchips, microchips having interconnecting structures that are keyed to ensure assembly of the microchips in only one orientation, and the electrical connection of microchips utilizing interconnect nodules (a.k.a., quilt packaging (QP) nodules) that protrude beyond edges of microchips.

Description of Related Art

System in package (SiP) is a combination of multiple electronic components of different functionality, assembled together to provide multiple functions associated with the system or sub-system. A SiP component may be an active integrated circuit dye, passive components, MEMS devices, optical components as well as other packaging and devices.

Quilt packaging (QP) is a SiP chip-to-chip interconnect technology which utilizes "nodules" that extend from, project, or protrude out from vertical facets along edges of substrates, such as integrated circuit chips (microchips) or PCBs, to allow for inter-substrate electrical connection, mechanical fastening, and alignment. QP technology enables interconnection of multiple substrates fabricated with similar or dissimilar technologies or substrate materials to be integrated into a monolithic-like structure.

Due to the nature of the QP manufacturing process, the geometry of the nodules and chips/component substrate are lithographically-defined, which allows for the application/specific definition of the substrate-to-substrate gap and alignment, in addition to overall package-level system architecture. QP is a complementary packaging approach to existing SiP technologies, such as 3-D chip stacking and flip chip. Details regarding quilt packaging (QP) and the formation of QP nodules can be found in U.S. Pat. No. 7,612,443 to Bernstein et al. which is incorporated herein by reference in its entirety.

Disclosed herein is a substrate assembly and a method of self-assembly of said substrate assembly for microchips that include quilt package (QP) nodules. In addition, presented is an alternative method of fabricating QP nodules through castellated protruding substrate edge features.

SUMMARY OF THE INVENTION

Various preferred and non-limiting examples will now be described as set forth in the following numbered clauses:

Cause 1: A substrate assembly comprises: a first microchip including a first interconnecting structure; and a second microchip including a second interconnecting structure, wherein the first and second interconnecting structures have complementary, interlocking shapes; wherein the first interconnecting structure is interlocked with the second interconnecting structure.

Clause 2: The assembly of clause 1, wherein: a first material used to form a body of the first microchip also forms the first interconnecting structure; and a second material used to form a body of the second microchip also forms the second interconnecting structure.

Clause 3: The assembly of clause 1 or 2, wherein: the first material is a first semiconductor material; and the second material is a second semiconductor material, wherein the first and second semiconductor materials can be the same material or different materials.

Clause 4: The assembly of any one of clauses 1-3, further comprising: a first quilt package nodule protruding beyond an edge of the first microchip; and a second quilt package nodule protruding beyond an edge of the second microchip substrate in contact with an end or a side of the first quilt package nodule.

Clause 5: The assembly of any one of clauses 1-4, wherein each quilt package nodule is formed of electrically conductive material.

Clause 6: The assembly of any one of clauses 1-5, wherein the first and second microchips include respective first and second circuits, and the first and second quilt package nodules electrically connect the first and second circuits.

Clause 7: The assembly of any one of clauses 1-6, wherein the complementary, interlocking shapes of the first and second interconnecting structures include at least one of the following: a curved or circular projection and a curved or circular slot or hole; a polygon shaped projection and a polygon shaped receiving slot; and a t-shaped projection and a t-shaped slot.

Clause 8: The assembly of any one of clauses 1-7, wherein: the first interconnecting structure is a first quilt package nodule; and the second interconnecting structure is a second quilt package nodule.

Clause 9: The assembly of any one of clauses 1-8, wherein the complementary shapes of the first and second quilt package nodules include at least one of the following: first and second L-shapes; a T-shape quilt package nodule and a T-shaped receiving slot; a curved or rounded projection and a curved or rounded receiving slot; a stair-stepped projection and a stair-stepped receiving slot; and a V-shaped projection and a V-shaped receiving slot.

Clause 10: The assembly of any one of clauses 1-9, wherein the first and second interconnecting structures are keyed to ensure assembly of the first and second interconnecting structures in only one orientation.

Clause 11: The assembly of any one of clauses 1-10, wherein: the first interconnecting structure comprises a first cavity in a surface of the first microchip; and the second interconnecting structure comprises a first projection on a side of the second microchip, wherein interlocking the first interconnecting structure and the second interconnecting structure comprises the first projection being inserted in the first cavity.

Clause 12: The assembly of any one of clauses 1-11, wherein: the first projection includes a quilt package nodule protruding beyond an edge of the first projection; and the first cavity includes in a nodule socket configured to receive the quilt package nodule when the first projection is inserted in the first cavity.

Clause 13: The assembly of any one of clauses 1-12, wherein: the first interconnecting structure comprises a nodule socket in the surface of the first microchip; and the second interconnecting structure comprises a quilt package nodule protruding beyond an edge of a recess in the side of the second microchip, wherein the socket is configured to receive the quilt package nodule when the first projection is inserted in the first cavity.

Clause 14: The assembly of any one of clauses 1-13, wherein: the first interconnecting structure comprises a second cavity formed in the surface of the first microchip; and the second interconnecting structure comprises a second projection on the side of the second microchip, wherein interlocking the first interconnecting structure and the second interconnecting structure comprises the second projection being inserted in the second cavity.

Clause 15: The assembly of any one of clauses 1-14, wherein: the first and second projections include first and second quilt package nodules protruding beyond edges of the first and second projections, respectively; and the first and second cavities include first and second nodule sockets configured to receive the first and second quilt package nodules when the first and second projections are inserted in the first and second cavities.

Clause 16: A method of forming a quilt package nodule on an edge of a microchip substrate comprises: (a) forming a trench in a microchip substrate, wherein the trench includes a bottom and first and second sides; (b) following step (a), forming a metal layer on the bottom, the first and second sides of the trench, and on a top surface of the microchip substrate proximate the first and second sides; (c) following step (b), forming a mask layer on the exposed surfaces of the metal layer; (d) following step (c), removing portions of the mask and metal layers on the bottom of the trench; (e) following step (d), etching the bottom of the trench to increase the depth of the bottom of the trench; (f) following step (e), removing remaining portions of the mask layer from the surfaces of the metal layer, whereupon remaining portions of the metal layers on the first and second sides define quilt package nodules that protrude beyond edges of the first and second sides; and (g) following step (f), removing the remaining portion of the trench bottom thereby separating the first and second sides from each other, whereupon each side includes at least one quilt package nodule protruding from said side.

Clause 17: The method of clause 16, wherein each side includes a plurality of quilt package nodules that protrude beyond the edge of said side.

Clause 18: The method of clause 16 or 17, wherein the etching of step (e) forms an undercut between the metal layers on the first and second sides and the bottom of the trench.

DESCRIPTION OF THE INVENTION

The following disclosure will be with reference to the accompanying figures and examples where like reference numbers correspond to like or functionally equivalent elements.

Figure 1A:
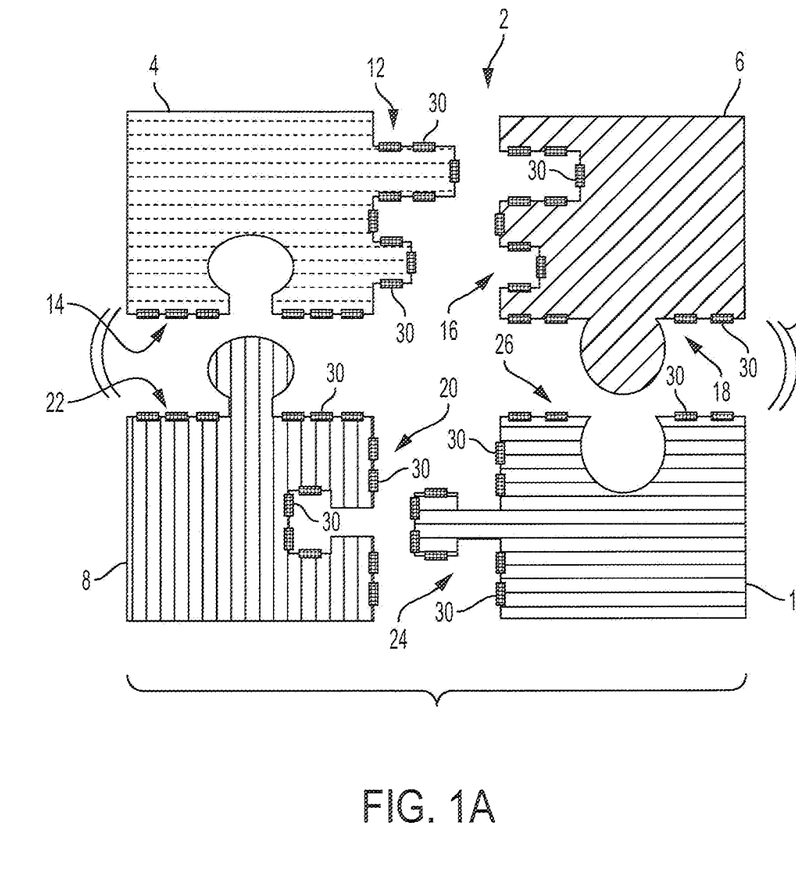
FIG. 1A is an exploded top view of a substrate assembly including four microchips including interconnecting structures having complementary shapes formed in the body of each microchip, and including quilt packaging (QP) nodules along edges of each microchip.
Figure 1B:
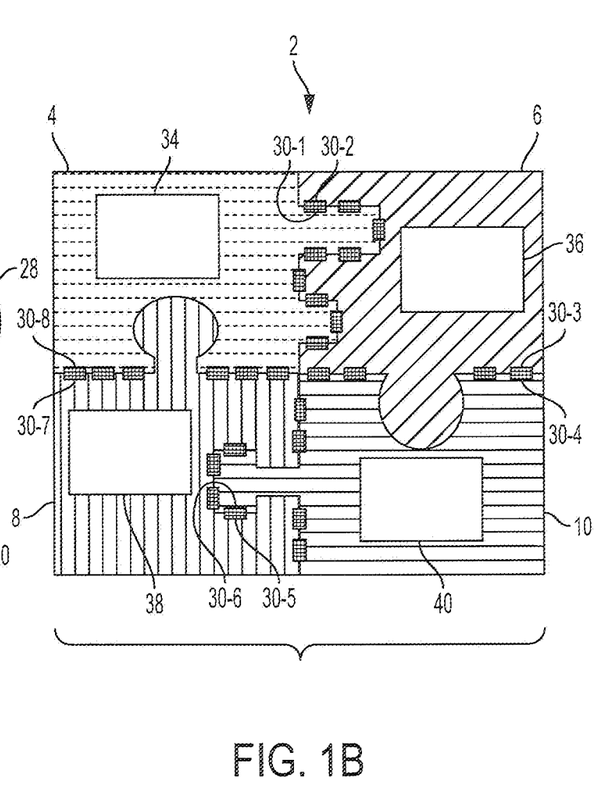
FIG. 1B is an assembled view of the substrate assembly shown in FIG. 1A.

With reference to FIGS. 1A and 1B, a first example substrate assembly 2 can include two, three, or more microchips joined by interconnecting structures formed in the body or substrate material forming each microchip. The example substrate assembly 2 shown in FIGS. 1A-1B includes four microchips 4, 6, 8, and 10. However, this is not to be construed in a limiting sense.

In this example, microchip 4 includes first and second interconnecting structures 12 and 14 formed along different side edges thereof; microchip 6 includes first and second interconnecting structures 16 and 18 formed along different side edges thereof; microchip 8 includes first and second interconnecting structures 20 and 22 formed along different side edges thereof; and microchip 10 includes first and second interconnecting structures 24 and 26 formed along different side edges thereof.

In this example, interconnecting structures 12 and 16 have keyed complementary, interlocking shapes; interconnecting structures 14 and 22 have keyed complementary interlocking shapes; interconnecting structures 18 and 26 have keyed complementary, interlocking shapes; and interconnecting structures 20 and 24 have keyed complementary, interlocking shapes. While each pair of interconnecting structures shown in the example substrate assembly 2 of FIGS. 1A and 1B include different shaped keyed complementary, interlocking shapes, this is not to be construed in a limiting sense.

A benefit of each pair of keyed complementary, interlocking shapes is that microchips 4, 6, 8, and 10 can only be assembled in one arrangement/orientation, as shown in FIG. 1B. In this regard, each interconnecting structure is only keyed to, and complementary and interlocking with one other interconnecting structure—and is incompatible with all of the other interconnecting structures. However, this is not to be construed in a limiting sense since the use of any shaped interconnecting structure is envisioned, provided microchips 4-10 can be assembled in a suitable arrangement/orientation.

An advantage of microchips 4-10 having different keyed complementary interconnecting structures include the ability to assemble microchips 4-10 in an automated manner via random motion 28, e.g., via vibration 28 of microchips 4-10 on a suitable substrate in a manner known in the art, e.g., a vibration table.

Each interconnecting structure can include one or more quilt electrically conductive package (QP) nodules 30 formed on one or more edges thereof that can be used to provide electrical connectivity between each pair of microchips having their keyed complementary, interconnecting shapes coupled together and/or as further interconnecting structures to provide mechanical stability between each said pair of microchips. QP nodules 30 and the method of making QP nodules 30 is known in the art and will not be further described herein for simplicity. Details regarding QP nodules and one method for forming QP nodules can be found in U.S. Pat. No. 7,612,443, wherein QP nodules are referred to as "interconnect nodules".

As can be seen in FIG. 1B, when the first and second interconnecting structures of each microchip 4-10 are interlocked in a manner shown in FIG. 1B, QP nodules 30 of keyed complementary, interlocking shapes can be in contact with each other. For example, QP nodules 30-1 and 30-2 of microchips 4 and 6 can be in contact; QP nodules 30-3 and 30-4 of microchips 6 and 10 can be in contact; QP nodules 30-5 and 30-6 of microchips 10 and 8 can be in contact; and QP nodules 30-7 and 30-8 of microchips 8 and 4 can be in contact.

As can be seen, QP nodules can be part of the keyed complementary interlocking shapes as shown, for example, by interconnecting structures 12, 16 (QP nodules 30-1 and 30-2), and 20, 24 (QP nodules 30-5 and 30-6). Also or alternatively, QP nodules can be included along edges of interconnecting structures as shown, for example, by interconnecting structures 18, 26 (QP nodules 30-3 and 30-4), and 14, 22 (QP nodules 30-7 and 30-8). Due to ease of formation, QP nodules 30 can be desirably formed along straight edges of microchips versus on curved or rounded surfaces. However, this is not to be construed in a limiting sense since it is envisioned that QP nodules can also or alternatively be formed on curved or rounded surfaces.

The purpose of the electrically conductive QP nodules 30 in contact with each other when microchips 4-10 are assembled in the manner shown in FIG. 1B is to electrically connect circuitry on adjacent microchips. For example, circuitry 34 of microchip 4 can be electrically connected to circuitry 36 of microchip 6 via the QP nodules 30 in contact with each other on microchips 4 and 6. Similarly, circuitry 34 can be electrically connected with circuitry 38 of microchip 8 via the QP nodules 30 in contact with each other on microchips 4 and 8. Finally, circuitry 40 of microchip 10 can be electrically connected with one or both of circuitry 36 and 38 via the QP nodules 30 in contact with each other on microchips 10 and 8, and/or microchips 10 and 6.

In other words, QP nodules 30 on different microchips that are in contact with each other can electrically connect electrical circuits on said microchips.

In FIGS. 1A and 1B, the material forming the body or substrate of each microchip can also form the interconnecting structure or structures. In an example, the first material (e.g., silicon) used to form the body of microchip 4 can also form interconnecting structures 12 and 14; the material used to form the body of microchip 6 can also form interconnecting structures 16 and 18; the material used to form the body of microchip 8 can also form interconnecting structures 20 and 22; and the material forming the body of microchip 10 can also form interconnecting structures 24 and 26.

Each interconnecting structure can be formed utilizing semiconductor fabrication processes and techniques well known in the art of semiconductor processing, e.g., photolithographic processing and etching, laser etching, and the like. However, this is not to be construed in a limiting sense. In an example, QP nodules 30 can be formed on each microchip in the manner disclosed in U.S. Pat. No. 7,612,443 incorporated herein by reference.

Figure 2A:
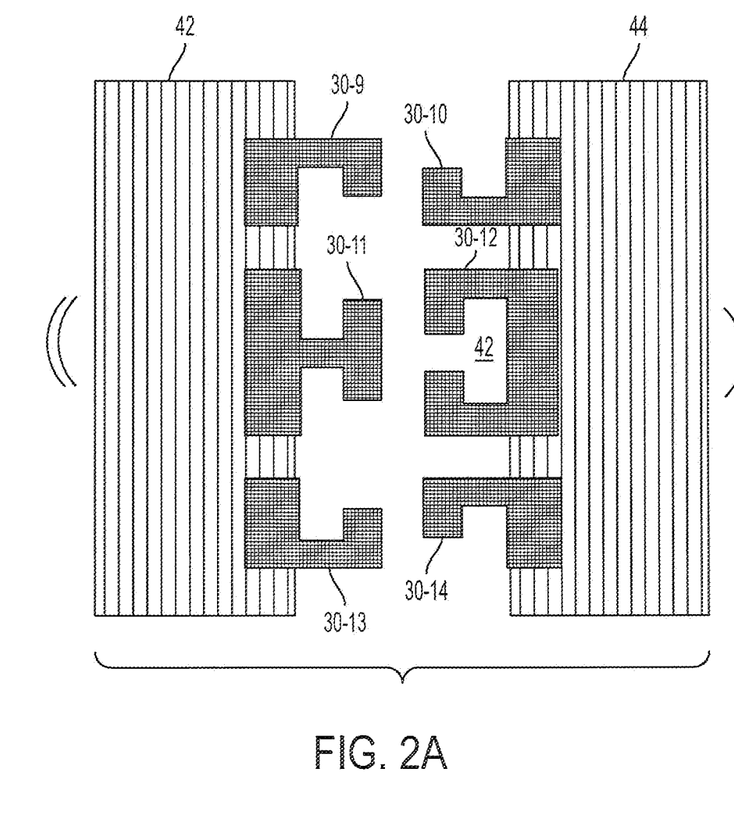
FIG. 2A is an exploded view of a substrate assembly including first and second microchips having first and second interconnecting structures in the form of quilt package (QP) nodules, having complementary shapes.
Figure 2B:
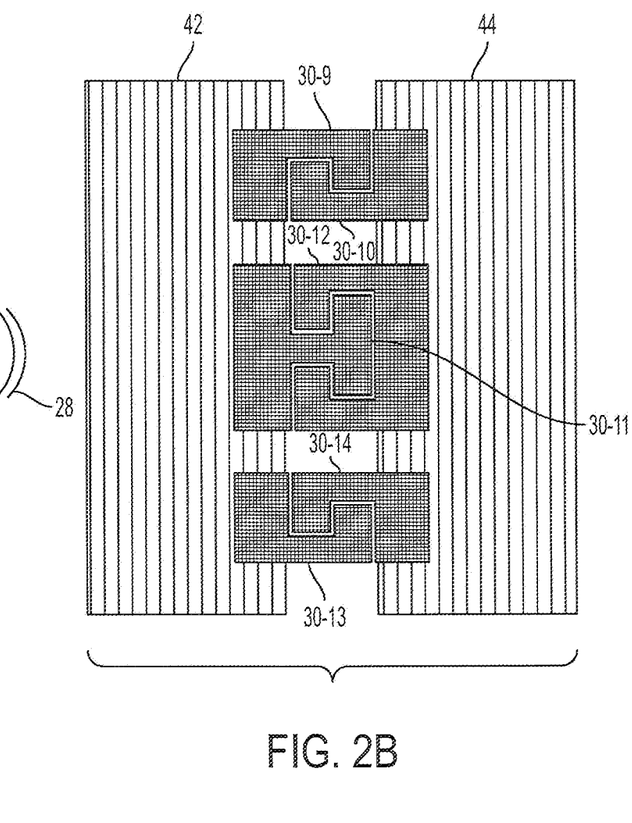
FIG. 2B is an assembled view of the substrate assembly shown in FIG. 2A.

With reference to FIGS. 2A and 2B, instead of microchips including interconnecting structures formed of the same material used to form the bodies of said microchips, in an example, the QP nodules 30 formed on the microchips can be confirmed to have keyed complementary, interlocking shapes. In the example shown in FIGS. 2A and 2B, microchips 42 and 44 can include QP nodules 30-9-30-14 having keyed complementary, interlocking shapes. In this example, QP nodules 30-9 and 30-10 can have keyed complementary, interlocking L-shapes; QP nodule 30-11 can have a T-shape and QP nodule 30-12 can have a keyed complementary, interlocking T-shaped receiving slot 42, the latter of which can be that is formed by a pair of L-shaped QP nodules. Finally, QP nodules 30-13 and 30-14 can, like QP nodules 30-1 and 30-2, have keyed complementary, interlocking L-shapes.

The keyed complementary, interlocking interconnecting structures in the form of QP nodules 30-9 and 30-14 shown in FIGS. 2A and 2B, however, is not to be construed in a limiting sense since it is envisioned that microchips 42 and 44 can include any suitable and/or desirable form or shape of keyed complementary, interlocking shapes that enable QP nodule pairs 30-9, 30-10; 30-11, 30-12; and 30-13, and 30-14 to be used as interconnecting structures.

Figure 3A:
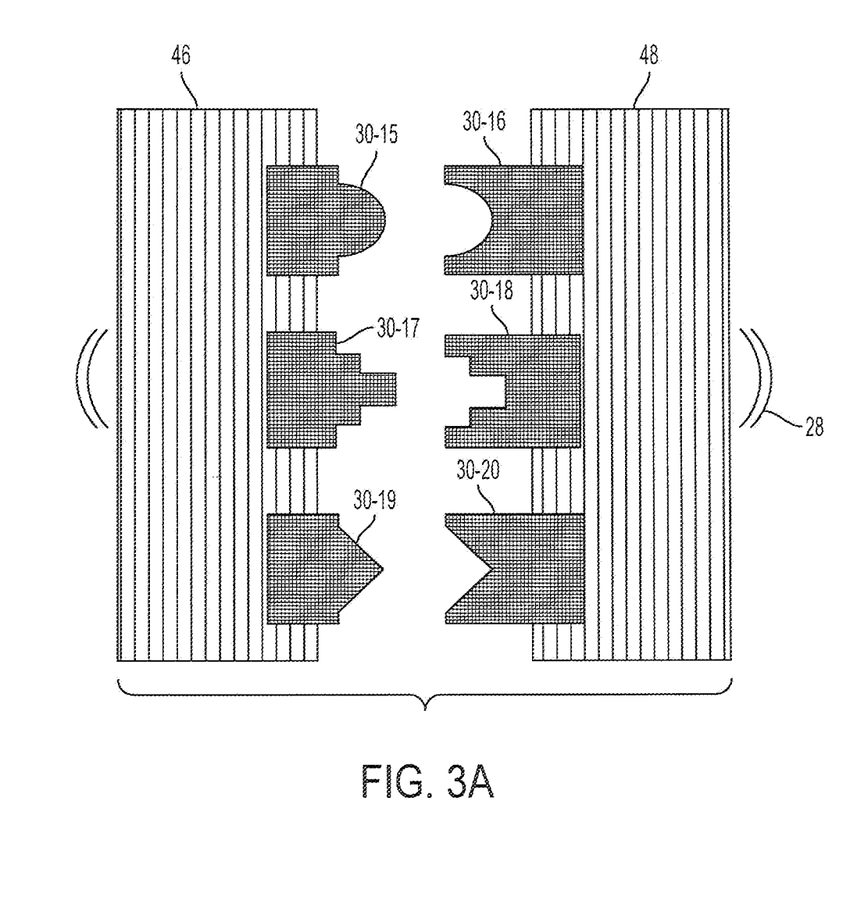
FIG. 3A is an exploded view of a substrate assembly including a first microchip having a number of first interconnecting structures, in the form of QP nodules, having different shapes and a second microchip having a number of different second interconnecting structures, in the form of QP nodules, with complementary shapes.
Figure 3B:
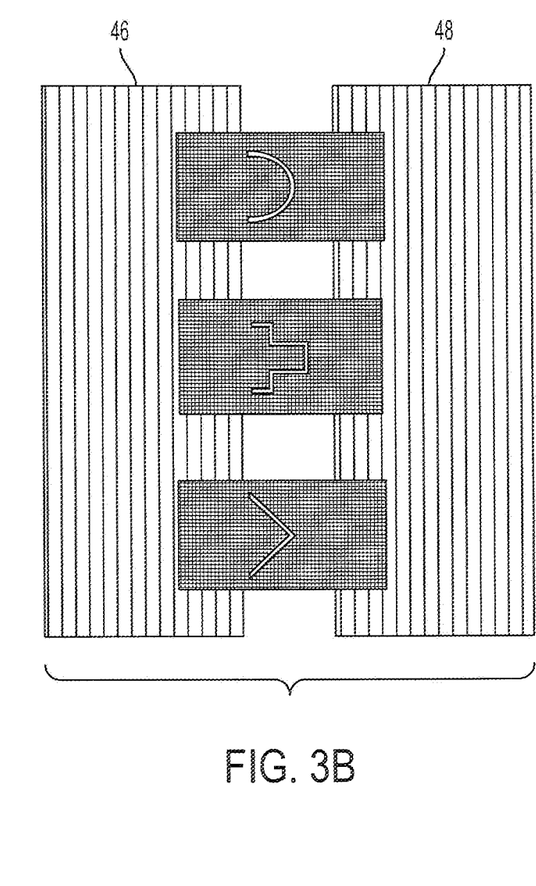
FIG. 3B is an assembled view of the substrate assembly shown in FIG. 3A.

With reference to FIGS. 3A and 3B, in another example, microchips 46 and 48 can include any one or combination of interconnecting structures in the form of QP nodule pairs 30-15, 30-16; 30-17, 30-18; and/or 30-19, 30-20. In this example, the complementary shapes of the QP nodules include curved or rounded projection 30-15 and curved or rounded receiving slot 30-16; a stair-stepped projection 30-17 and a stair-step receiving slot 30-18; and/or a V-shaped projection 30-18 and a V-shaped receiving slot 30-20.

The illustration in FIGS. 3A and 3B of different shaped projections and receiving slots is not to be construed in a limiting sense since it is envisioned that the same style QP nodule projection and QP nodule receiving slot can be used a multitude of times on microchips 46 and 48. Moreover, the illustration in FIGS. 3A and 3B of microchip 46 including one or more QP nodule structures including projections and microchip 48 including one or more keyed, complementary QP nodule receiving slots is not to be construed in a limiting sense since it is envisioned that each microchip can include QP nodules having any suitable and/or desirable combination of projections and keyed, complementary receiving slots. Further, the QP nodule projections and receiving slots on each microchip can be the same or different shapes.

In the examples shown in FIGS. 1A-3B, the various complementary, interlocking shapes can be keyed to ensure the assembly of the various interconnecting structures and, hence, microchips, in only one orientation. For example, in FIGS. 1A and 1B, interconnecting structure 16 includes two different size/depth cavities, while the keyed complementary, interconnecting structure 12 includes complementary sized projections, wherein each projection of interlocking structure 12 is configured to be inserted in a correspondingly sized cavity of interlocking structure 16.

In the example shown in FIGS. 1A and 1B, each interconnecting structure 12-26 can include a QP nodule 30 protruding beyond an edge of the corresponding microchip. When the microchips are assembled in the form shown in FIG. 1B, each QP nodule protruding beyond an edge of one microchip can be in contact with an end or a side of a QP nodule extending from another microchip.

In the examples shown in FIGS. 2A-3B each interconnecting structure is a QP nodule itself versus the combination of a shape formed in the body of material forming a microchip and conventional QP nodules 30 formed on the corresponding microchip.

Figure 4A:
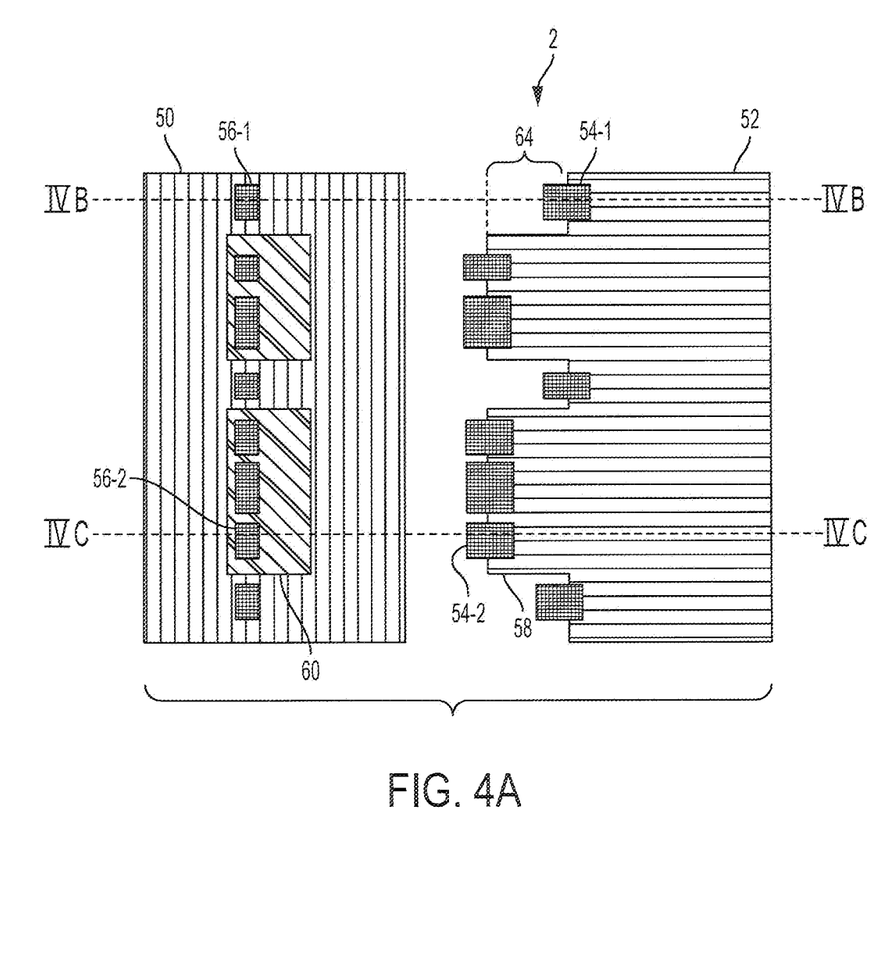
FIG. 4A (left) is a top view of a microchip with cavities and castellation sockets and FIG. 4A (right) is a side view of a microchip including edge castellations (including QP nodules) configured to be inserted into the castellation sockets.
Figure 4B:
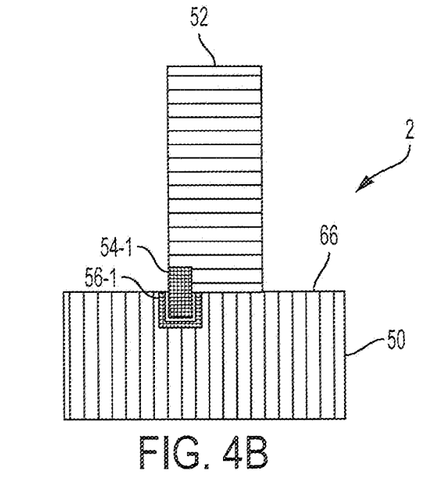
FIG. 4B is an assembled view of the microchips shown in FIG. 4A taken along line IVB-IVB in FIG. 4A.
Figure 4C:
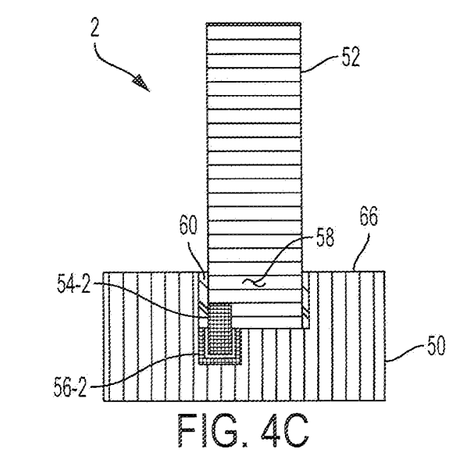
FIG. 4C is an assembled view of the microchips shown in FIG. 4A taken along line IVC-IVC in FIG. 4A.

With reference to FIGS. 4A-4C, an example non-planar substrate assembly 2 including keyed complementary, interlocking structures will now be described.

FIG. 4A (left) shows a top view of a microchip 50 that includes QP nodule sockets 56 and microchip sockets or cavities 60, and FIG. 4A (right) is a side view of a microchip 52 that includes substrate projections 58 and recesses 64, and QP nodules 54 protruding beyond one or more of said projections 58 and recesses 64.

FIG. 4B is a cross-section of microchips 50 and 52 assembled together taken along line IVB-IVB in FIG. 4A. As can be seen, when microchips 50 and 52 are assembled in the manner shown in FIG. 4B, QP nodule 54-1 protruding from an edge of recess 64 of microchip 52 is received in a QP nodule socket 56-1 formed in a top surface 66 of microchip 50.

FIG. 4C is a view of microchips 50 and 52 assembled together taken along lines IVC-IVC in FIG. 4A. As shown in FIG. 4C, a projection 58 of microchip 52 includes QP nodule 54-2 and microchip 50 includes a corresponding microchip socket or cavity 60, including a QP nodule socket 56-2 for receiving QP nodule 54-2 protruding from an edge of projection 58 when projection 58 is inserted into microchip cavity 60. QP nodules 54 protruding beyond one or more edges of microchip 52 can be electrically connected in a manner known in the art to circuitry formed on microchip 52. Similarly, each nodule socket 56 can be electrically connected in a manner known in the art to circuitry formed on microchip 50. When microchips 50 and 52 are assembled in the manner shown in FIGS. 4B-4C, circuits on microchips 50 and 52 can be electrically connected via the insertion of QP nodules 54 into nodule sockets 56.

As can be seen, in contrast to QP nodule 54-2 projecting from an edge of projection 58, QP nodule 54-1 projects from a recess 64 of microchip 52.

Microchip 52 including projections and recesses having QP nodules 54 and/or microchip 50 including sockets 56 formed in a surface 66 and in microchip sockets 60 formed in surface 66 can be formed in any suitable and/or desirable manner. In an example, the combination of one or more recesses 64, one or more projections 58, one or more QP nodules 54, one or more nodule sockets 56 in a surface 66 of microchip 50, one or more microchip sockets 60, and one or more nodule sockets 56 in said microchip sockets 60 can be formed in any suitable and/or desirable manner that enables microchips 50 and 52 to be keyed for assembly in one orientation.

For example, in the example shown in FIGS. 4A-4C, the interconnecting structure of microchip 52 includes two projections 58 and three recesses 64. Correspondingly, microchip 50 includes two microchip sockets or cavities 60 configured to receive the two projections 58 of microchip 52 inserted therein. The projections 58 of microchip 52 includes quilt package nodules 54 that protrude from edges of said projections 58 and the corresponding microchip sockets 60 of microchip 50 include corresponding nodule sockets 56 configured to receive the quilt package nodules 54 protruding from the edges or ends of projections 58 of microchip 52 when said projections 58 are inserted into cavities 60.

The example shown in FIGS. 4A-4C is exemplary only and is not to be construed in a limiting sense since it is envisioned that microchips 50 and 52 can be formed in any suitable and/or desirable manner to include any combination of projections, recesses, microchip sockets, QP nodules, and/or nodule sockets as deemed suitable and/or desirable to ensure that the interconnecting structures on microchip 50 and the corresponding interconnecting structures on microchip 52 are keyed to ensure assembly of microchips 50 and 52 in only one orientation.

Figure 5A:
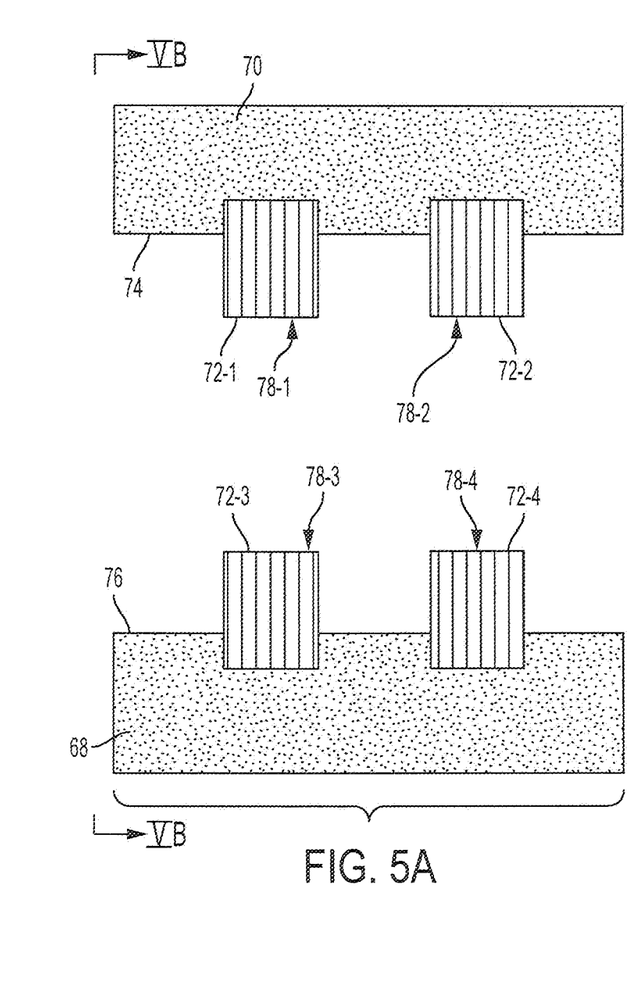
FIG. 5A is a top view of a pair of microchips including QP nodules formed in the manner described in connection with FIGS. 6A-6G.
Figure 5B:
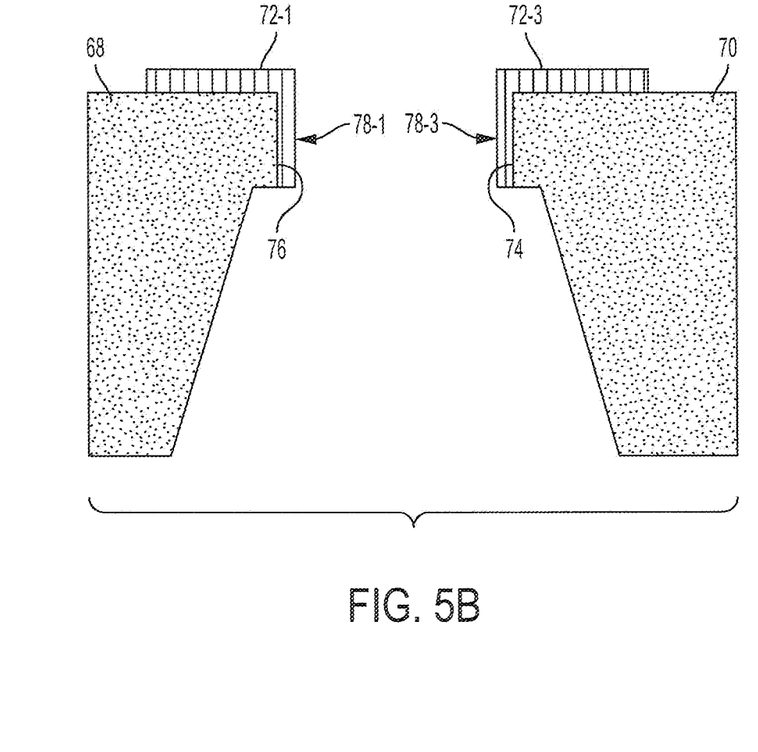
FIG. 5B is a side view take along line VB-VB in FIG. 5A.

With reference to FIGS. 5A and 5B, FIGS. 5A-5B show respective top and side views of first and second microchips 68 and 70 including QP nodules 72-1 and 72-2 of microchip 70 in spaced facing relationship with QP nodules 72-3 and 72-4 of microchip 68. In this example, each QP nodule 72 projects, extends, or protrudes from a side surface of the corresponding microchip. For example, QP nodules 72-1 and 72-2 protrude from a side surface 74 and edge of microchip 70, and QP nodules 72-3 and 72-4 protrude from a side surface 76 and edge of microchip 68. As will be described in further detail hereinafter, microchips 68 and 70 can be formed from the same microchip substrate. Each microchip 68 and 70 can include the same or different circuitry.

Each QP nodule 72 of each microchip can contact a QP nodules of another microchip via end-to-end, face-to-face, or side-to-side contact of the surfaces of the QP nodules. It is to be appreciated that QP nodules 72 of microchip 68 and 70 are not necessarily moved into contact. Rather, the sides and/or faces 78 of the QP nodule 72 of each microchip 68 and 70 can be joined in contact end-to-end, face-to-face, or side-to-side with a QP nodule of another substrate (not shown).

Having described microchips 68 and 70, a method of forming microchips 68 and 70 with QP nodules 72 thereon will now be described with reference to FIGS. 6A-6G.

Figure 6A:
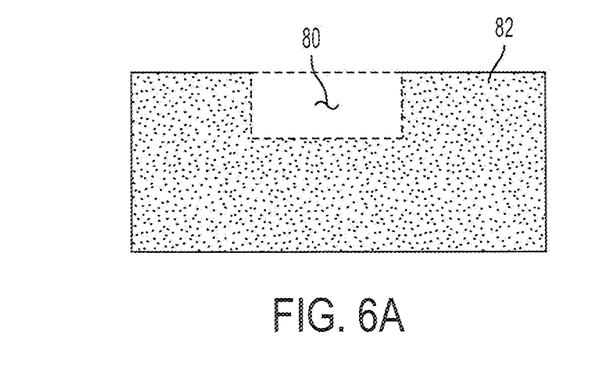
FIGS. 6A-6G are views of the steps of a method for forming the microchips including QP nodules shown in FIGS. 5A and 5B from a common microchip substrate.

Referring to FIG. 6A, in the method, a trench 80 can be formed in a top surface of microchip substrate 82 utilizing semiconductor processing techniques known in the art.

Figure 6B:
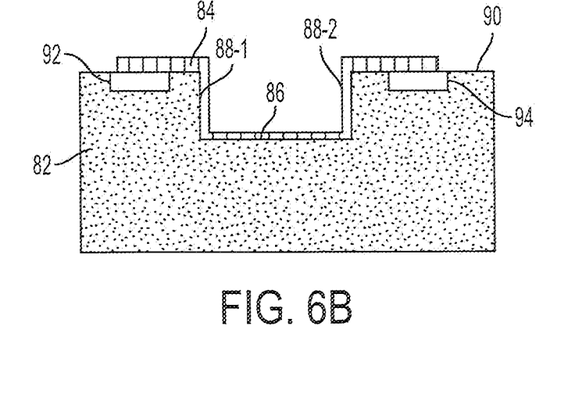

With reference to FIG. 6B and with continuing reference to FIG. 6A, next a metal layer 84 can be formed on the bottom 86 and sides 88-1 and 88-2 of trench 80, and on the top surface of microchip substrate 82 proximate to trench 80 in a manner known in the art, e.g., the Damascene process.

The portions of metal layer 84 on the top surface 90 of microchip substrate 82 can connect to circuitry 92 and 94 formed in or on the surface of microchip substrate 82.

Figure 6C:
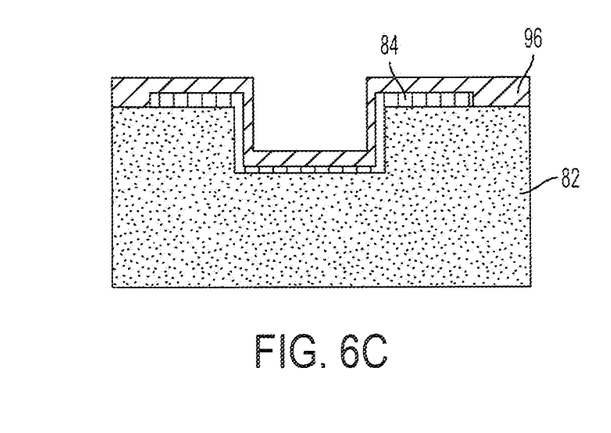

Next, as shown in FIG. 6C, a mask layer 96 can be formed on at least the exposed surfaces of metal layer 84. In an example, mask layer 96 can be a photoresist.

Figure 6D:
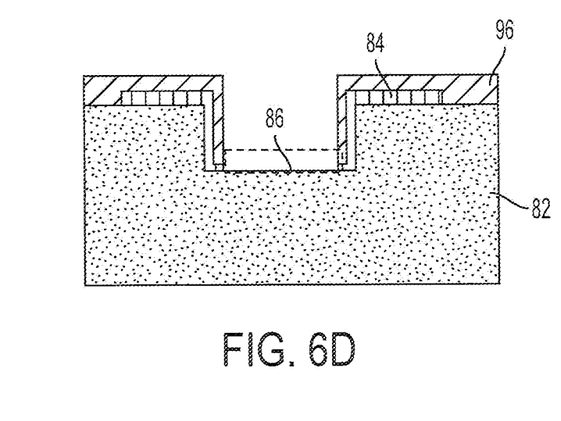

Next, as shown in FIG. 6D, via a mask (e.g., a photomask—not shown), mask layer 96 can be exposed to an appropriate wavelength of UV light, whereupon the portion of mask layer 96 on bottom 86 of trench 80 is (or is made) soft and soluble in the presence of a liquid developer and the remaining portions of mask layer 96 are hard (or remain hard) whereupon these remaining portions are not capable of being washed away by the developer.

Next, as also shown in FIG. 6D, the portions of mask layer 96 and metal layer 84 on the bottom 86 of trench 80 can be removed via appropriate developer and etching solutions.

Figure 6E:
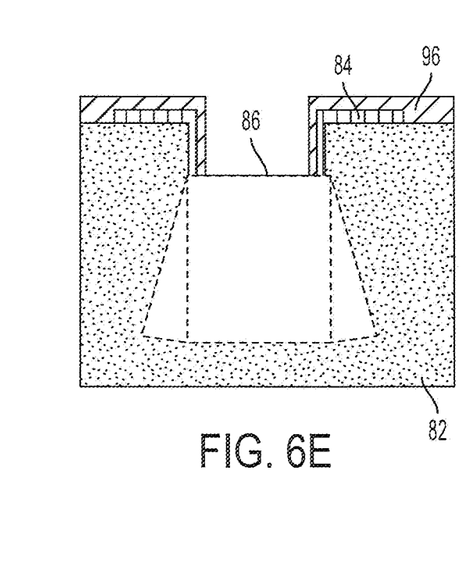

Thereafter, as shown in FIG. 6E the portion of microchip substrate at the bottom 86 of trench 80 can be etched. In an example, the etching of microchip substrate 82 at the bottom 86 of trench 80 can be anisotropic whereupon the depth and width of the bottom of the trench increase (diverge) as shown in FIG. 6E. In another example, etching of microchip substrate 82 at the bottom 86 of trench 80 can be isotropic, as shown by dashed lines in FIG. 6E.

Figure 6F:
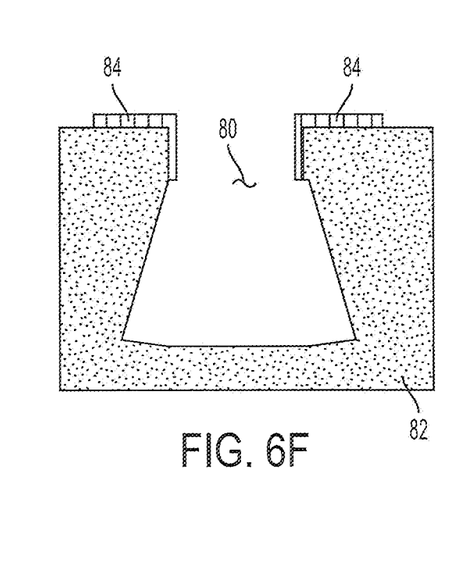

As shown in FIG. 6F, after etching trench 80 to increase its depth (as shown in FIG. 6E), mask layer 96 is removed leaving microchip substrate 82 and metal layers 84. For the purpose of description, it will be assumed that an anisotropic etch is used to increase the depth and width of the bottom of the trench to the shape shown in FIG. 6F.

Figure 6G:
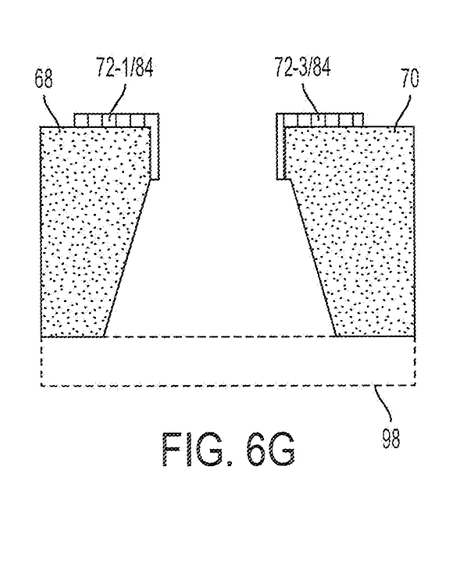

Finally, as shown in FIG. 6G, the remaining material 98 at the very bottom of microchip substrate 82 is removed, e.g., via a backside grind, to produce microchips 68 and 70 having QP nodules 72-1 and 72-4 in the view shown in FIGS. 5A-5B.

As can be seen, disclosed herein is a substrate assembly that includes microchips formed to have keyed complementary, interlocking shapes. In one example, the keyed complementary, interlocking shapes are formed from the substrate material forming each microchip and the electrical interconnections between assembled substrates can be via QP nodules formed along edges of each substrate.

In another example, the keyed complementary, interlocking shapes can be formed from the QP nodules themselves. Of course, combinations of keyed complementary, interlocking shapes formed from substrate material and QP nodules is envisioned. In another example, the keyed complementary, interlocking shapes can include nodule sockets and QP nodules on different microchips. Each microchip in this example can include any number or combination of nodule sockets and QP nodules configured to mate with corresponding QP nodules and nodule sockets on the other microchip.

Finally, forming microchips with QP nodules 72 thereon is disclosed. The sides and/or faces 78 of each said QP nodule 72 can be joined in contact end-to-end, face-to-face, or side-to-side with a QP nodule of another substrate.

The examples have been described with reference to the accompanying figures. Modifications and alterations will occur to others upon reading and understanding the foregoing examples. Accordingly, the foregoing examples are not to be construed as limiting the disclosure.

The invention claimed is:

1. A substrate assembly comprising:
a first microchip including a first interconnecting structure, wherein the first interconnecting structure is a tab; and
a second microchip including a second interconnecting structure, wherein the second interconnecting structure is a notch, wherein the tab and the notch have complementary, interlocking shapes;
wherein the tab is interlocked with the notch, wherein:
a first material forming a body of the first microchip also forms the tab that includes a distal end and a pair of sides that extend from the body of the first microchip to the distal end of the tab; a second material forming a body of the second microchip also forms the notch that includes a pair of sides;
the tab includes a first electrically conductive quilt package nodule protruding beyond one of the sides of the tab;
the notch includes a second electrically conductive quilt package nodule protruding beyond one of the sides of the notch; and
the first and second electrically conductive quilt package nodules are in contact with each other.

2. The assembly of claim 1, wherein:
the first material is a first semiconductor material; and
the second material is a second semiconductor material, wherein the first and second semiconductor materials are same material or different materials.

3. The assembly of claim 1, further comprising:
a third quilt package nodule protruding beyond the distal end of the tab; and
a fourth quilt package nodule protruding beyond a base of the notch in contact with the third quilt package nodule.

4. The assembly of claim 1, wherein:
the first and second microchips include respective first and second circuits, and
the first and second quilt package nodules electrically connect the first and second circuits.

5. The assembly of claim 1, wherein:
the tab includes a plurality of first electrically conductive quilt package nodules protruding beyond the at least one side or the pair of sides of the tab;
the notch includes a plurality of second electrically conductive quilt package nodules protruding beyond the at least one side or the pair of sides of the notch; and
each first electrically conductive quilt package nodule of the plurality of first electrically conductive quilt package nodules is in contact with one of the second electrically conductive quilt package nodules of the plurality of second electrically conductive quilt package nodules.

6. A substrate assembly comprising:
a first microchip including a first electrically conductive quilt package nodule that protrudes from a vertical facet of an edge of the first microchip; and
a second microchip including a second electrically conductive quilt package nodule that protrudes from a vertical facet of an edge of the second microchip, wherein the first and second electrically conductive quilt package nodules have complementary, interlocking shapes that mate or interlock with each other spaced from the bodies of the first and second microchips.

7. The assembly of claim 6, wherein the complementary shapes of the first and second electrically conductive quilt package nodules include at least one of the following:
first and second L-shapes;
a T-shape quilt package nodule and a T-shaped receiving slot;
a curved or rounded projection and a curved or rounded receiving slot;
a stair-stepped projection and a stair-stepped receiving slot; and
a V-shaped projection and a V-shaped receiving slot.

8. The assembly of claim 6, wherein the first and second electrically conductive quilt package nodules are keyed to ensure assembly of the first and second electrically conductive quilt package nodules in only one orientation.

9. A substrate assembly comprising:
a first microchip including a first interconnecting structure; and
a second microchip including a second interconnecting structure, wherein the first and second interconnecting structures have complementary, interlocking shapes;
wherein the first interconnecting structure is interlocked with the second interconnecting structure, wherein:
a first material used to form a body of the first microchip also forms the first interconnecting structure;

a second material used to form a body of the second microchip also forms the second interconnecting structure;

the first interconnecting structure comprises in a top surface of the first microchip a first cavity that is spaced from a perimeter of the first microchip; and the second interconnecting structure comprises a first projection on a side of the second microchip, wherein interlocking the first interconnecting structure and the second interconnecting structure comprises the first projection being inserted in the first cavity.

10. The assembly of claim 9, wherein:

the first projection includes a quilt package nodule protruding beyond an edge of the first projection; and the first cavity includes in a nodule socket configured to receive the quilt package nodule when the first projection is inserted in the first cavity.

11. The assembly of claim 9, wherein:

the first interconnecting structure comprises a nodule socket in the top surface of the first microchip; and the second interconnecting structure comprises a quilt package nodule protruding beyond an edge of a recess in the side of the second microchip, wherein the nodule socket is configured to receive the quilt package nodule when the first projection is inserted in the first cavity.

12. The assembly of claim 9, wherein:

the first interconnecting structure comprises a second cavity formed in the top surface of the first microchip; and the second interconnecting structure comprises a second projection on the side of the second microchip, wherein interlocking the first interconnecting structure and the second interconnecting structure comprises the second projection being inserted in the second cavity.

13. The assembly of claim 12, wherein:

the first and second projections include first and second quilt package nodules protruding beyond edges of the first and second projections, respectively; and the first and second cavities include first and second nodule sockets configured to receive the first and second quilt package nodules when the first and second projections are inserted in the first and second cavities.

\* \* \* \* \*